(12) United States Patent
Matsuoka

(10) Patent No.: US 6,985,376 B2
(45) Date of Patent: Jan. 10, 2006

(54) NONVOLATILE SEMICONDUCTOR STORAGE APPARATUS HAVING REDUCED VARIANCE IN RESISTANCE VALUES OF EACH OF THE STORAGE STATES

(75) Inventor: Nobuaki Matsuoka, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 68 days.

(21) Appl. No.: 10/704,267

(22) Filed: Nov. 6, 2003

(65) Prior Publication Data

US 2004/0095805 A1    May 20, 2004

(30) Foreign Application Priority Data

Nov. 6, 2002    (JP)    ............... 2002-323064

(51) Int. Cl.
*G11C 11/00*    (2006.01)

(52) U.S. Cl. .................... 365/148; 365/185.03

(58) Field of Classification Search ................ 365/148, 365/185.03

See application file for complete search history.

(56) References Cited

U.S. PATENT DOCUMENTS

| 5,912,839 A | * | 6/1999 | Ovshinsky et al. | .... 365/185.03 |
| 6,519,180 B2 | * | 2/2003 | Tran et al. | ............ 365/185.03 |

FOREIGN PATENT DOCUMENTS

JP    2002-140889    5/2002

* cited by examiner

*Primary Examiner*—Tuan T. Nguyen
(74) *Attorney, Agent, or Firm*—Morrison & Foerster LLP

(57) ABSTRACT

A nonvolatile semiconductor storage apparatus including: a first memory cell capable of storing a plurality of data values; a second memory cell capable of storing a plurality of data values; a resistance regulation section capable of regulating resistance, which regulates resistance such that a difference between a resistance value of a first connection line connected to the first memory cell and a resistance value of a second connection line connected to the second memory cell is reduced.

15 Claims, 9 Drawing Sheets

NONVOLATILE SEMICONDUCTOR STORAGE APPARATUS HAVING REDUCED VARIANCE IN RESISTANCE VALUES OF EACH OF THE STORAGE STATES

BACKGROUND OF THE INVENTION

1. Field of the Invention

The present invention relates to a nonvolatile semiconductor storage apparatus.

2. Description of the Related Art

One known nonvolatile semiconductor storage apparatus is a floating-gate type flash memory. Data is written to a floating-gate type flash memory by injecting charges to a floating gate to change a threshold voltage of a MOS transistor.

FIG. 7 is a circuit diagram showing an important part of a conventional floating-gate type flash memory 700.

In the flash memory 700, a plurality of memory cells M111 through M11j are arranged within a matrix. Each memory cell includes a MOS transistor having a floating gate. In the flash memory 700, a plurality of word lines and a plurality of source lines oriented along a row direction are alternately located and a plurality of bit lines are oriented along a column direction.

In order to simplify the description, FIG. 7 shows j memory cells M111 through M11j which are connected to one word line WL1.

Furthermore, in order to simplify the description, FIG. 7 shows one memory cell connected to each bit line, but in the whole flash memory 700, a plurality of memory cells are connected to each bit line.

Gates of the respective j MOS transistors located along the row direction are connected to a common word line WL11. Sources of the MOS transistors are connected to a common source line S11. More specifically, the source line S11 is shared by the plurality of memory cells M111 through M11j.

Drains of a plurality of MOS transistors are respectively connected to each bit line Bit11 through Bit1j.

For writing data into a memory cell, one of the bit lines Bit11 through Bit1j is selected by a selector 11. A write voltage is applied to the memory cell connected to the selected bit line via the selected bit line.

Besides the floating-gate type flash memory, a ferromagnetic memory is known as another type of nonvolatile semiconductor storage apparatus. A ferromagnetic memory uses a variable resistance element which is capable of selecting an electric resistance value by selecting a magnetization direction of a ferromagnet. The ferromagnetic memory is also referred to as an MRAM (magnetic random access memory).

FIG. 8 is a circuit diagram showing an important part of a conventional ferromagnetic memory 800.

The ferromagnetic memory 800 is a 1T1R (one-transistor-one-resistance) type memory using a variable resistance element. Such a ferromagnetic memory 800 is described in, for example, Japanese Laid-Open Publication No. 2002-140889.

In the ferromagnetic memory 800, a plurality of memory cells M111 through M11j are arranged within a matrix. Each of the memory cells includes an n-type MOS transistor which acts as a current control element and a variable resistance element.

In the ferromagnetic memory 800, a plurality of word lines and a plurality of source lines oriented along a row direction are alternately located and a plurality of bit lines are respectively oriented along a column direction.

In order to simplify the description, FIG. 8 shows j memory cells M111 through M11j which are connected to one word line WL11.

Furthermore, FIG. 8 shows one memory cell connected to each bit line, but in the whole ferromagnetic memory 800, a plurality of memory cells are connected to each bit line.

Gates of the respective plurality of MOS transistors 111a through 11ja located along the row direction are connected to a common word line WL11. Sources of the MOS transistors 111a through 11ja are connected to a common source line S11 via variable resistance elements 111b through 11jb corresponding to the MOS transistors. More specifically, the source line S11 is shared by the plurality of memory cells M111 through M11j.

Drains of a plurality of MOS transistors 111a through 11ja are respectively connected to each bit line Bit11 through Bit1j.

For writing data into a memory cell, one of the bit lines Bit11 through Bit1j is selected by a selector 11. A write voltage is applied to the memory cell connected to the selected bit line via the selected bit line.

In the floating-gate type flash memory 700 of FIG. 7, charges are injected to a floating gate as follows. A voltage is applied to a gate of a MOS transistor via a word line, for example. Also, a voltage is applied to a drain of the MOS transistor via a bit line. A source of the MOS transistor is connected to a ground voltage Vss via a source line. Thus, hot electrons are generated near the drain of the MOS transistor.

Herein, when a resistance value of a source line per memory cell is assumed to be R0, a cumulative resistance value of the source line at the memory cell M111, for example, is (R0×j). The cumulative resistance value of the source line at the memory cell M11j is R0. Thus, the cumulative resistance value at the memory cell M111 is j times the cumulative resistance value at the memory cell M11j.

Such a difference in the cumulative resistance values of the source line at memory cells causes problems such as differences in source-drain potentials of the MOS transistors and a variation in threshold voltages (ON resistances).

Similar to the flash memory 700 described above, in the ferromagnetic memory 800 using a variable resistance element of FIG. 8, cumulative resistance values of the source line at each of memory cells vary depending on the position of the memory cell. Thus, for example, after the same data value is written to two different memory cells, a variance in states of the memory cells (more specifically, resistance values of the variable resistance element) is generated.

Such a variance in the memory cell states may be a big problem particularly when a multi-level technique is introduced so that a memory cell can store three or more data values. This problem will be described in detail below with reference to FIGS. 9A and 9B.

FIG. 9A is a graph showing a probability distribution of resistance values of a memory cell which is capable of storing two data values. FIG. 9B is a graph showing a probability distribution of resistance values of a memory cell which is capable of storing four data values. In FIGS. 9A and 9B, horizontal axes indicate resistance values of memory cells and vertical axes indicate probability distributions.

As shown in FIG. 9A, in the case where a memory cell is capable of storing two data values, resistance values of memory cells are required to be within two ranges, i.e., a range from Ra to Ra' and a range from Rb to Rb'. A memory cell having a resistance value within the range from Ra to Ra' is allocated with data value "0". A Memory cell having a resistance value within the range from Rb to Rb' is allocated with data value "1".

As shown in FIG. 9B, in the case where a memory cell is capable of storing four data values, resistance values of memory cells are required to be within four ranges, i.e., a range from R1 to R1', a range from R2 to R2', a range from R3 to R3', and a range from R4 to R4'. A memory cell having a resistance value within the range from R1 to R1' is allocated with data value "0". A memory cell having a resistance value within the range from R2 to R2' is allocated with data value "1". A memory cell having a resistance value within the range from R3 to R3' is allocated with data value "2". A memory cell having a resistance value within the range from R4 to R4' is allocated with data value "3".

In general, a maximum and a minimum resistance values of a memory cell are fixed. Thus, Ra=R1 and Rb'=R4'. Accordingly, in a memory cell which is capable of storing four data values, the resistance values of the memory cell should be controlled within a narrower range than in a memory cell which is capable of storing two data values.

Therefore, when differences in cumulative resistance values of a source line at each of the memory cells is generated in accordance with the positions of the memory cells, and thus a variance in states of memory cells is generated, resistance values may not fall within narrow permissible ranges of each of the states. Thus, incorrect data may be obtained.

In a conventional nonvolatile semiconductor storage apparatus, irrespective of positions of memory cells, a constant voltage is applied to a source line. Thus, it is not easy to suppress a variance in cumulative resistance values of the source line at each of the memory cells in accordance with the positions of the memory cells. In particular, as a capacity of a memory is increased and a multi-level technique is introduced as a method for increasing a capacity, it is required to reduce a variance in resistance values of each of the storage states.

SUMMARY OF THE INVENTION

According to one aspect of the present invention, there is provided a nonvolatile semiconductor storage apparatus comprising: a first memory cell capable of storing a plurality of data values; a second memory cell capable of storing a plurality of data values; a resistance regulation section capable of regulating resistance, which regulates resistance such that a difference between a resistance value of a first connection line connected to the first memory cell and a resistance value of a second connection line connected to the second memory cell is reduced.

In one embodiment of the present invention, the first memory cell includes a first transistor having a first gate, a first source, and a first drain; the second memory cell includes a second transistor having a second gate, a second source, and a second drain; the first connection line includes a first bit line connected to the first drain and a first source line connected to the first source; and the second connection line includes a second bit line connected to the second drain and a second source line connected to the second source.

In one embodiment of the present invention, the first memory cell includes a first transistor having a first gate, a first source, and a first drain; the second memory cell includes a second transistor having a second gate, a second source, and a second drain; the first connection line includes a first source line connected to the first source; and the second connection line includes a second source line connected to the second source.

In one embodiment of the present invention, an address signal designating the first memory cell or the second memory cell is input to the resistance regulation section; and the resistance regulation section regulates resistance based on the address signal.

In one embodiment of the present invention, the resistance regulation section is connected to the first source line and the second source line.

In one embodiment of the present invention, the resistance regulation section is provided before start portions of the first bit line and the second bit line.

In one embodiment of the present invention, the resistance regulation section regulates resistance based on a position of the first memory cell and a position of the second memory cell.

In one embodiment of the present invention, the first memory cell includes a first serial circuit in which a first variable resistance element and a first current control element are connected in series, one end of the first serial circuit being connected to the first bit line and other end of the first serial circuit being connected to the first source line; and the second memory cell includes a second serial circuit in which a second variable resistance element and a second current control element are connected in series, one end of the second serial circuit being connected to the second bit line and other end of the second serial circuit being connected to the second source line.

In one embodiment of the present invention, each of the first variable resistance element and the second variable resistance element includes PCMO ($Pr_{0.7}Ca_{0.3}MnO_3$).

In one embodiment of the present invention, the first memory cell includes a first MOS transistor having a first floating gate, one end of the first MOS transistor being connected to the first bit line and the other end of the first MOS transistor being connected to the first source line; and the second memory cell includes a second MOS transistor having a second floating gate, one end of the second MOS transistor being connected to a second bit line and the other end of the second MOS transistor being connected to the second source line.

In one embodiment of the present invention, the first memory cell and the second memory cell are each capable of storing three or more data values.

In one embodiment of the present invention, the resistance regulation section includes a plurality of resistance elements and controls the number of resistance elements, among the plurality of resistance elements, which are electrically connected to the first connection line and the second connection line.

In one embodiment of the present invention, the resistance regulation circuit includes: a resistance section in which a plurality of resistance elements are connected in series; a plurality of switch elements, the switch elements being connected to both ends of the resistance section and a connection portion to which the plurality of the resistance elements are connected; and a selection circuit for selecting whether to turn on or off each of the plurality of the switch elements based on an address signal designating the first memory cell or the second memory cell, the selection circuit selecting whether to turn on or off each of the plurality of the switch elements such that the resistance of the resistance section is changed.

In one embodiment of the present invention, the resistance regulation section includes: a transistor having a gate, a source, and a drain; and a transformation circuit for changing a gate voltage to be applied to the gate of the transistor based on an address signal designating the first memory cell or the second memory cell, the transformation circuit changing the gate voltage such that an ON resistance of the transistor is changed.

In one embodiment of the present invention, the resistance regulation section includes: a plurality of wiring paths each having a different resistance value; a plurality of switch elements corresponding to the plurality of wiring paths, each of the plurality of switch elements is provided in a respective one of the plurality of wiring paths; and a selection circuit for selecting whether to turn on or off each of the plurality of the switch elements based on an address signal designating the first memory cell or the second memory cell, the selection circuit selecting at least one of the plurality of wiring paths by using each of the plurality of switch elements.

Hereinafter, effects of the present invention having a structure described above will be described.

According to the present invention, a resistance regulation section reduces a difference in cumulative resistance values of connection lines, connected to a plurality of memory cells, at each of memory cells. Thus, it is possible to prevent the memory cells from not being properly accessed due to a difference in cumulative resistance values of connection lines connected to the memory cells at each of the memory cells.

Furthermore, at at least one of an end of a source line and an end of a bit line, a resistance value corresponding to a position of a memory cell in accordance with an address signal designating an address of the memory cells is added to at least one of source line resistance values and bit line resistance values at each of the memory cells, which are varied depending on the positions of the memory cells, so that the sum total of path resistances is balanced. Thus, it is possible to suppress a variance in storage states of the memory cells.

In particular, in a nonvolatile semiconductor storage apparatus having memory cells which are capable of storing a plurality of data values, permissible operational ranges in each of the storage states are narrow. Thus, it is preferable to reduce a variance in storage states of the memory cells due to differences in source line resistance values and bit line resistance values.

Thus, the invention described herein makes possible the advantages of providing a nonvolatile semiconductor storage apparatus which can prevent data stored in a memory cell from not being properly accessed during an access to a memory cell such as a write operation, erase operation, read operation and the like to a memory cell.

These and other advantages of the present invention will become apparent to those skilled in the art upon reading and understanding the following detailed description with reference to the accompanying figures.

DESCRIPTION OF THE PREFERRED EMBODIMENTS

Hereinafter, a nonvolatile semiconductor storage apparatus according to the present invention will be described with reference to the drawings.

EXAMPLE 1

Figure 1:
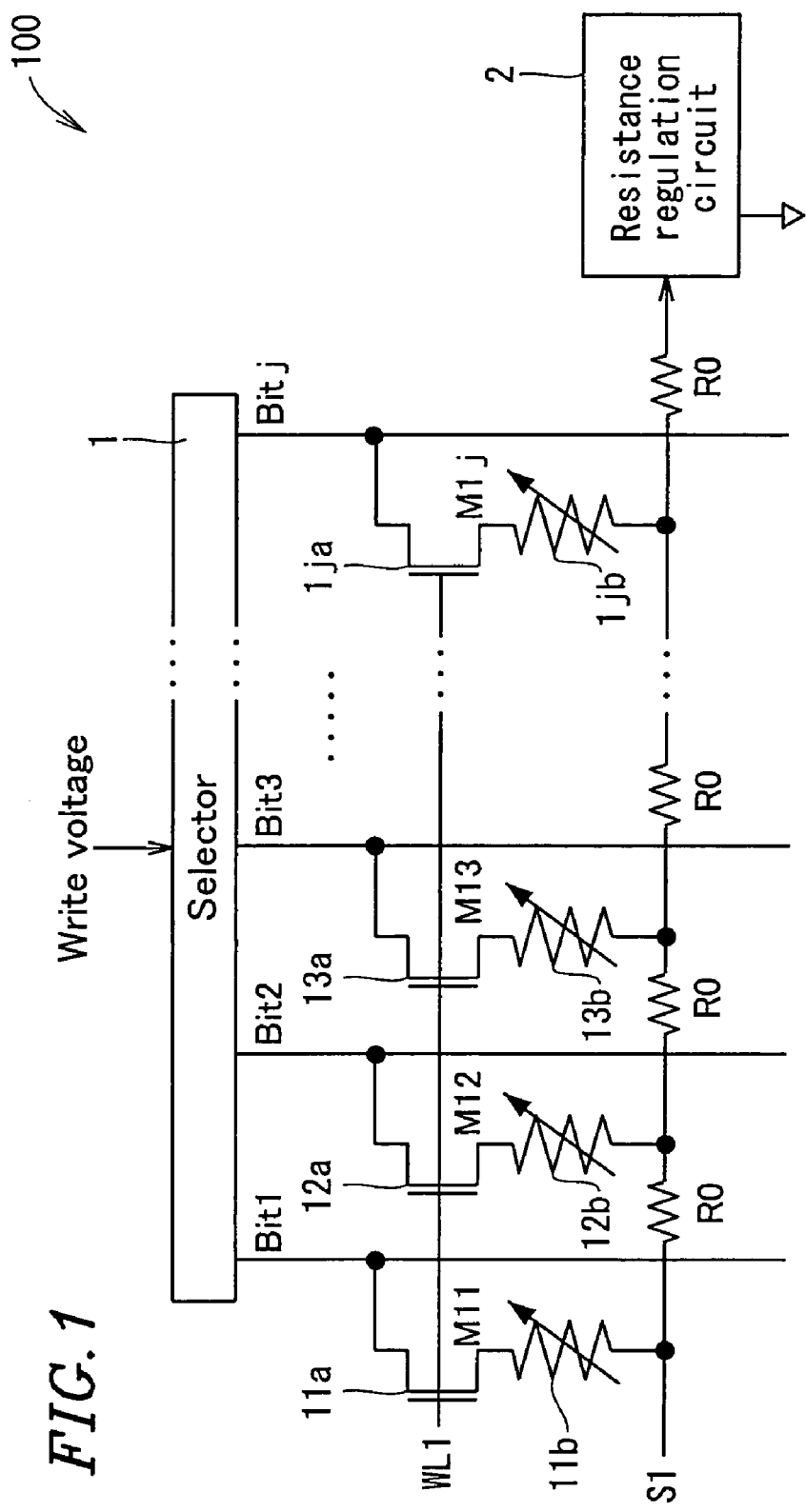
FIG. 1 is a circuit diagram showing one line of an important part of a nonvolatile semiconductor storage apparatus according to Example 1 of the present invention.

FIG. 1 is a circuit diagram showing one line of an important part of a nonvolatile semiconductor storage apparatus 100 according to Example 1 of the present invention.

The nonvolatile semiconductor storage apparatus 100 comprises a memory array including a plurality of memory cells M11 through Mnj (n and j are natural numbers) arranged in a matrix. Each of the memory cells M11 through Mnj is a 1T1R memory using a variable resistance element and a current control element.

FIG. 1 illustrates one line (one row) of the memory cells M11 through M1j in the memory array. The memory cell is now described in more detail by considering one of the memory cells M11 through M1j, for example, a memory cell M11. The memory cell M11 includes an n-type MOS transistor 11a which acts as a current control element (also referred to as a selection transistor) and a variable resistance element 11b of which the resistance is varied by an electric pulse (a material thereof includes, for example, PCMO: $Pr_{0.7}Ca_{0.3}MnO_3$).

A plurality of word lines WL and a plurality of source lines S oriented along a row direction are alternately located and a plurality of bit lines Bit are oriented a column direction such that they pass near the corresponding ones of the plurality of memory cells arranged in a matrix.

In order to simplify the description, FIG. 1 shows j memory cells M11 through M1j which are connected to one word line WL1.

Gates of the plurality of the MOS transistors 11a through 1ja located along the row direction are connected to a common word line WL1. Sources of the MOS transistors 11a through 1a are connected to a common source line S1 via corresponding variable resistance elements 11b through 1jb. More specifically, the source line S1 is shared by the plurality of memory cells M11 through M1j. The source line S1 is considered as a combined line of the respective source lines of memory cells M11 through M1j.

Drains of a plurality of MOS transistors 11a through 1ja located are respectively connected to each bit line Bit1 through Bitj.

A bit line and a source line are connected to a memory cell. More specifically, for example, a bit line Bit1 and a source line S1 are connected to a memory cell M11.

Hereinafter, a bit line and/or a source line connected to a memory cell is referred to as a connection line.

For writing data into a memory cell, the bit lines Bit1 through Bitj are sequentially selected by a selector 1. A write voltage is applied to the memory cell connected to the selected bit line via the selected bit line.

In the nonvolatile semiconductor storage apparatus 100, a resistance regulation circuit 2 is connected at one end (the terminal end) of the source line S1. The resistance regulation circuit 2 regulates resistances such that a difference in cumulative resistance values of the source line at each of the memory cells which vary depending on positions of memory cells is reduced.

When a data write operation is performed in the nonvolatile semiconductor storage apparatus 100, the nonvolatile semiconductor storage apparatus receives an address signal designating an address of a memory cell into which data is to be written or a position of a memory cell into which data is to be written, or generates such an address signal by itself.

For example, cumulative resistance values of the source line at each of the memory cells are different between when an address signal designates the far left memory cell M11 and when an address signal designates the far right memory cell M1j. Herein, the difference between the cumulative resistance value of the source line at the memory cell M11 and the cumulative resistance value at the memory cell M1j is maximum.

As described above, since the cumulative resistance values of the source line at each of the memory cells vary, there is a big difference between a potential at a source of the memory cell M11 and a potential at a source of the memory cell M1j. The cumulative resistance value of the source line at the memory cell M11 is resistance value (R0×j). The cumulative resistance value of the source line at the memory cell M1j is resistance value R0. Thus, the cumulative resistance value of the source line at one memory cell may be j times the cumulative resistance value at another memory cell. A cumulative resistance value of the source line per memory cell is assumed to be R0.

In general, a difference in resistance values often reaches about few thousand ohms. For example, when a current of 1 mA passes through the source line S1, a potential difference around a few volts is generated in accordance with the positions of the memory cells. If there is such a difference in the cumulative resistance values of the source line, a source-drain potential of the MOS transistor 11a is different from that of the MOS transistor 1ja. Thus, a variance is generated in ON resistances of the MOS transistors.

Accordingly, in Example 1, for writing data into a memory cell M1j having a low cumulative resistance value of the source line at the memory cell, a predetermined voltage is applied to the source of the memory cell M1j after a predetermined resistance value is added in accordance with the cumulative resistance value of the source line corresponding to the position of the memory cell such that a source-drain potential, which is substantially the same as that for writing data into the memory cell M11 having a large cumulative resistance value of a source line at the memory cell, is applied by a resistance regulation circuit 2 (i.e., a difference between cumulative resistance values of the source line at each of the memory cells is reduced).

In this case, a voltage to be applied to a source line S1 is the same as those for writing data into the memory cell M1j and for writing data into the memory cell M11.

Thus, in accordance with the positions of the memory cells (i.e., the positions where the memory cells are connected to the source line S1), it is possible to reduce a difference in conditions for writing data.

In the above description, since cumulative resistance values of the bit line at each of the memory cells M11 through M1j are substantially equal, a difference in cumulative resistance values of the source line at each of the memory cells M11 through M1j is described. However, even when there is a difference in cumulative resistance values of the bit line at each of the memory cells M11 through M1j, as long as the resistance regulation circuit 2 acts to reduce a difference in cumulative resistance values of the bit line at each of the memory cells M11 through M1j, an effect similar to the above-described effect can be achieved.

Thus, the resistance regulation circuit 2 can achieve a result similar to the above-described effect, as long as a difference in cumulative resistance values of the connection line at each of the memory cells M11 through M1j is reduced.

Figure 2:
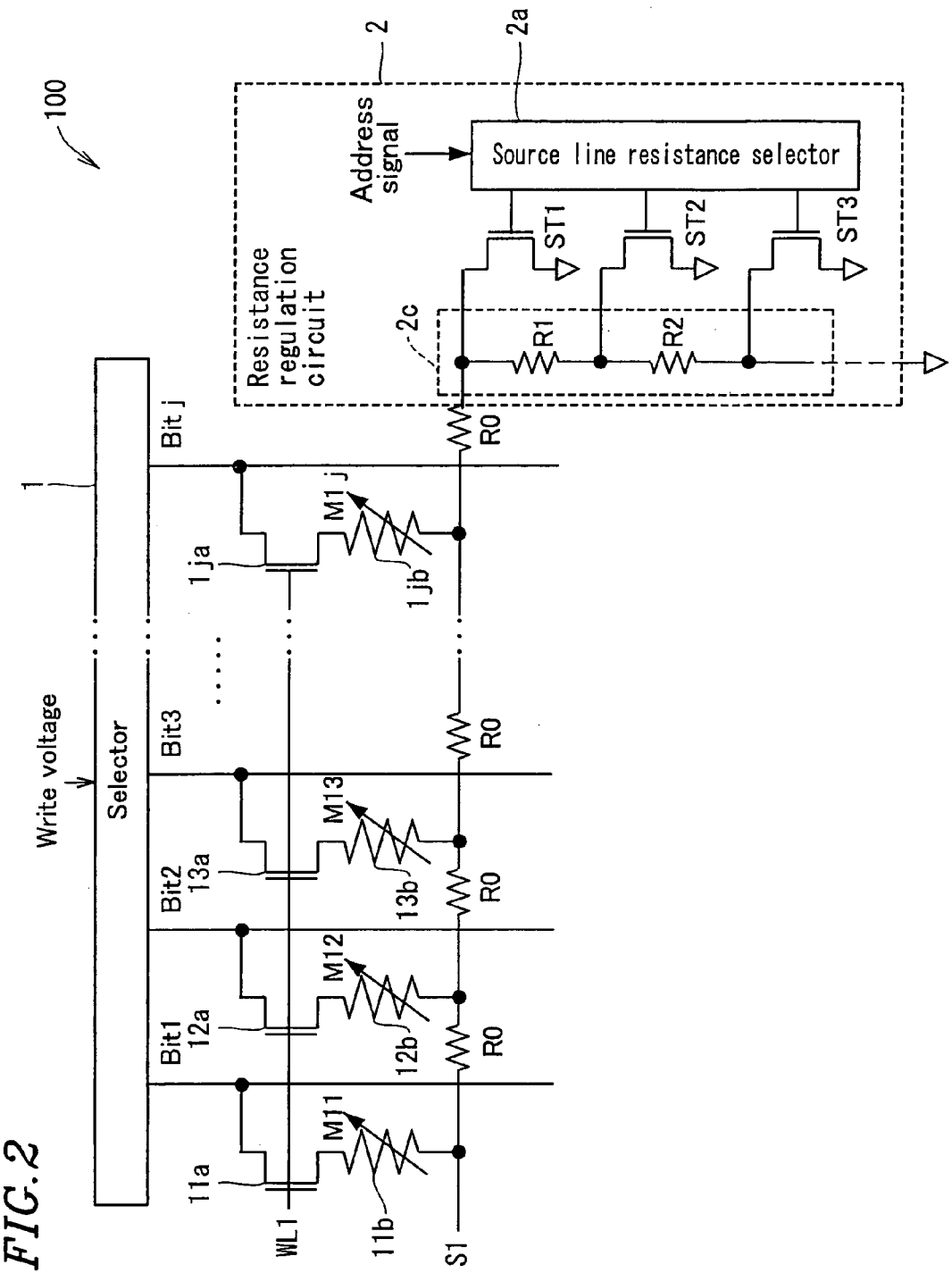
FIG. 2 is a circuit diagram illustrating an example of a resistance regulation circuit of FIG. 1.

FIG. 2 is a circuit diagram illustrating an example of the resistance regulation circuit 2 of FIG. 1. FIG. 2 shows a specific structure of the resistance regulation circuit 2 of FIG. 1.

In FIG. 2, the resistance regulation circuit 2 comprises a resistance section 2c in which a plurality of resistance elements R1 and R2 are connected in series, n-type MOS transistors ST1 through ST3 which act as a plurality of switch elements connected to both ends of the resistance section 2c and a connecting portion between the resistance elements R1 and R2, and a source line resistance selector 2a which acts as a selection circuit for selecting whether to turn on or off the n-type MOS transistors ST1 through ST3 based on an address signal.

FIG. 2 shows only two resistance elements, i.e., resistance element R1 and the resistance element R2, in the resistance section 2c. However, there may be any number of the resistance elements in the resistance section 2c.

The resistance values of the plurality of resistance elements connected in series in the resistance section 2c may be the same or may be different. However, in the case where the resistance values of the source line per memory cell are always R0, it is preferable that the plurality of resistance elements have the same resistance values.

The source line resistance selector 2a selects whether to turn on or off the n-type MOS transistors ST1 through ST3 based on an address signal, and change the resistance of the resistance section 2c. Thus, the resistance regulation circuit 2 can achieve a desired resistance value corresponding to the position of the memory cell (the position where the memory cell is connected to source line S1).

In a memory array in which the plurality of memory cells M11 through M1j are provided in a matrix, when an address signal designates the memory cell M11, the n-type MOS transistor ST1 is turned on in the resistance regulation circuit 2. Thus, a cumulative resistance value of the source line at the memory cell M11 is (R0×j).

When an address signal designates the memory cell M1j, the n-type MOS transistor ST3 is turned on and the n-type MOS transistors ST1 and ST2 are turned off in the resistance regulation circuit 2. Thus, the cumulative resistance value of the source line at the memory cell M1j is (R0+R1+R2). Herein, the resistance values of the resistance elements R1 and R2 are set to satisfy:

$$(R0 \times j) \approx (R0 + R1 + R2).$$

Thus, it is possible to reduce a difference in the write conditions in accordance with the positions of the memory cell M11 and the memory cell M1j.

Similarly, with respect to the memory cells M12 and M13, at least one of the n-type MOS transistors ST1 through ST3 is selected and controlled whether to switch on or off the n-type MOS transistors ST1 through ST3 such that the sum of cumulative resistance values of the source line at each of the memory cells and the resistance value of the resistance regulation circuit 2 become close to resistance value (R0×j). Thus, it is possible to perform regulation to relax (suppress or reduce) a difference in cumulative resistance values of the source line at each of the memory cells which vary depending on the positions of the memory cells (the positions where the memory cells are connected to the source line S1).

In the resistance regulation circuit 2, the source line resistance selector 2a selects which of the n-type MOS transistors ST1 through ST3 to turn on or off based on an address signal which has been input.

In the description above, three n-type MOS transistors ST1 through ST3 are provided as switch elements which can be selected, and the resistance is changed to achieve a desired resistance value corresponding to the positions of the memory cells. However, the number of the switch elements is not limited to this. The number of the switch elements may be, for example, j at maximum to match the number of the memory cells. When the number of the switch elements is j, j resistance elements may be provided so as to correspond to the switch elements, and the resistance value of each of the j resistance elements may be R0.

As described above, the resistance regulation circuit 2 includes a plurality of resistance elements, and it is possible to control the number of resistance elements, from the plurality of resistance elements, which are electrically connected to the source line S1.

In the description above, a method of selecting a switch element and changing the resistance to obtain a desired resistance value corresponding to the positions of the memory cells is described as an example of a method for regulating the resistance in the resistance regulation circuit 2. However, in the present invention, a method for regulating the resistance is not limited to such an example.

For example, a resistance may be regulated to obtain a desired resistance value corresponding to a position of a memory cell by controlling a voltage to be applied to a gate and changing an ON resistance of a switching transistor. Such a form will be described with reference to FIG. 3.

Figure 3:
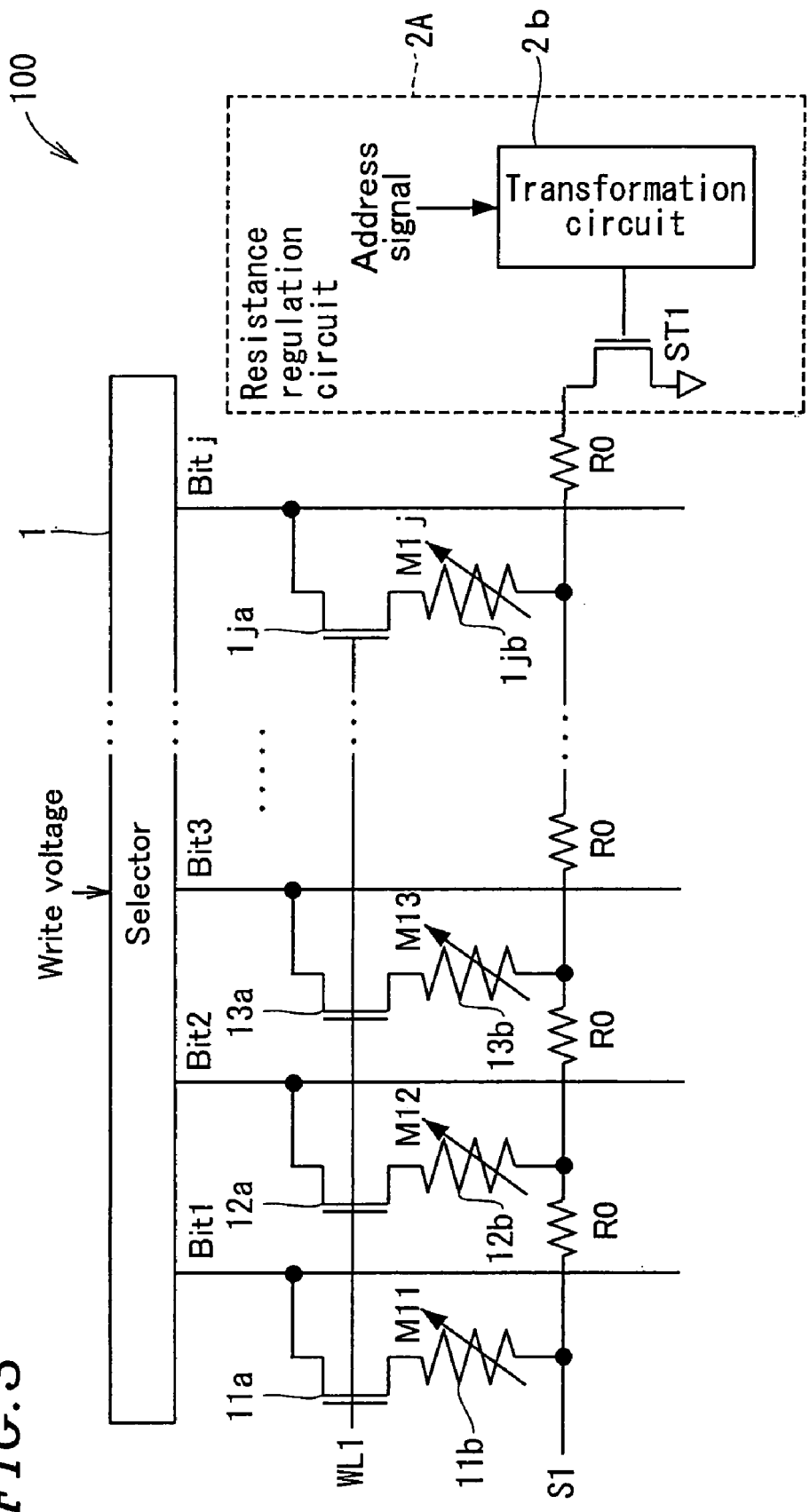
FIG. 3 is a circuit diagram illustrating another example of the resistance regulation circuit of FIG. 1.

FIG. 3 is a circuit diagram illustrating a resistance regulation circuit 2A, i.e., another example of the resistance regulation circuit 2 of FIG. 1.

The resistance regulation circuit 2A includes an n-type MOS transistor ST1 which acts as a switching transistor and a transformation circuit 2b which controls a gate voltage supplied to the n-type MOS transistor ST3 based on an address signal such that the gate voltage becomes variable.

An address signal is input to the transformation circuit 2b of the resistance regulation circuit 2A. The transformation circuit 2b controls a gate voltage to be applied to a gate of the n-type MOS transistor ST1 based on the address signal such that the gate voltage becomes variable. By changing an ON resistance of the n-type MOS transistor ST1, it is possible to obtain a desired resistance value corresponding to the position of the memory cell (the position where the memory cell is connected to the source line S1).

In a memory array in which a plurality of memory cells M11 through M1j are provided in a matrix, there is a difference between the cumulative resistance value of the source line at the memory cell when the memory cell M11 is selected and the cumulative resistance value of the source line at the memory cell when the memory cell M1j is selected.

For example, a gate voltage to be applied to a gate of the n-type MOS transistor ST1 is changed between the case where the memory cell M1j having a low cumulative resistance value at the memory cell is designated and the case where the memory cell M11 having a high cumulative resistance value at the memory cell is designated. Thus, the ON resistance of the n-type MOS transistor ST1 is changed.

More specifically, the ON resistance of the n-type MOS transistor ST1 is set such that it becomes larger when the memory cell M1j having a low cumulative resistance value at the memory cell is designated than when the memory cell M11 having a high cumulative resistance value at the memory cell is designated. Thus, it is possible to regulate resistances so that a difference in cumulative resistance values of the source line at each of the memory cells, which vary in accordance with the positions of the memory cells (the positions where the memory cells are connected to the source line S1), is relaxed (suppressed or reduced).

In the resistance regulation circuit 2A, the transformation circuit 2b controls a gate voltage to be applied to the n-type MOS transistor ST1 based an address signal which has been input.

As described above, according to a nonvolatile semiconductor storage apparatus of Example 1, the resistance regulation circuit 2 or the resistance regulation circuit 2A provided at one end (or a terminal end) of the source line can reduce a difference in cumulative resistance values of the source line at each of the memory cells in accordance with the positions of the memory cells. Thus, it is possible to regulate resistances such that a difference in cumulative resistance values of the source line at each of the memory cells, which vary depending on the positions of the memory cells (the positions where the memory cells are connected to the source line), is relaxed (suppressed or reduced).

EXAMPLE 2

In Example 1, a resistance regulation circuit is provided at a terminal end side of a source line. In Example 2, a resistance regulation circuit is provided before start portions of bit lines.

Figure 4:
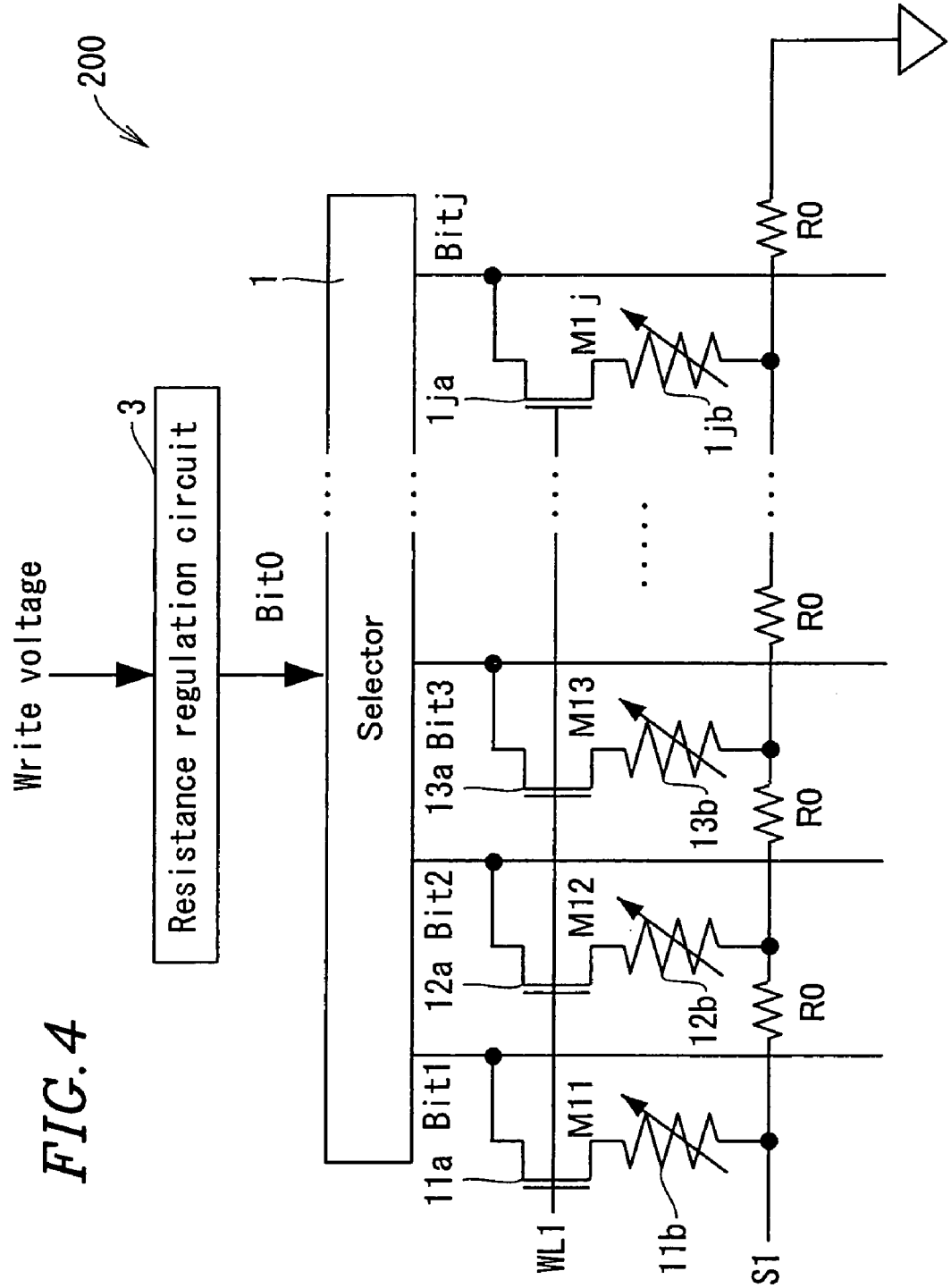
FIG. 4 is a circuit diagram showing one line of an important part of a nonvolatile semiconductor storage apparatus according to Example 2 of the present invention.

FIG. 4 is a circuit diagram showing one line of an important part in a nonvolatile semiconductor storage apparatus 200 according to Example 2 of the present invention.

As the nonvolatile semiconductor storage apparatus described with reference to Example 1, the nonvolatile semiconductor storage apparatus 200 comprises a memory array including a plurality of memory cells M11 through Mnj (n and j are natural numbers) arranged in a matrix. Each of the memory cells M11 through Mnj is a 1T1R memory using a variable resistance element and a current control element.

FIG. 4 illustrates one line (one row) of memory cells M11 through M1j in a memory array. The memory cell is described in more detail with respect to one of the memory cells M11 through M1j, for example, a memory cell M11. The memory cell M11 includes a serial circuit in which an n-type MOS transistor 11a and variable resistance elements 11b are connected in series. The n-type MOS transistor 11a acts as a current control element and is also referred to as a selection transistor. The variable resistance element 11b includes, for example, PCMO: $Pr_{0.7}Ca_{0.3}MnO_3$ as a material and the resistance is varied by an electric pulse.

A plurality of word lines and a plurality of source lines oriented along a row direction are alternately located and a plurality of bit lines are oriented along a column direction such that they pass near the plurality of memory cells.

Gates of the plurality of the MOS transistors $11a$ through $1ja$ located along the row direction are connected to a common word line WL1. Sources of the plurality of MOS transistors $11a$ through $1ja$ are connected to a common source line S1 via corresponding variable resistance elements $11b$ through $1jb$. Drains of a plurality of MOS transistors $11a$ through $1ja$ located are respectively connected to each bit line Bit1 through Bitj.

A bit line and a source line are connected to each memory cell. More specifically, for example, a bit line Bit1 and a source line S1 are connected to a memory cell M11.

For writing data into a memory cell, the bit lines Bit1 through Bitj are selected by a selector 1. A write voltage is applied to the memory cell connected to the selected bit line via the selected bit line.

In the nonvolatile semiconductor storage apparatus 200 according to Embodiment 2, a resistance regulation circuit 3 for regulating source line resistances is connected to start portions of the bit lines Bit1 through Bitj via a selector 1.

When a data write operation is performed in the nonvolatile semiconductor storage apparatus 200, a cumulative resistance value of the source line at the memory cell when an address signal designates the memory cell M11 and a cumulative resistance value of the source line at the memory cell when an address signal designates the memory cell M1$j$ are different. As described above with reference to Example 1, a potential difference of few volts may be generated in accordance with the positions of the memory cells.

When a difference in cumulative resistance values of the source line at each of the memory cells is generated, a difference in source-drain potentials of the MOS transistors is generated in accordance with the memory cells. Thus, a variance is generated in threshold voltages (ON resistances) of the MOS transistors.

Accordingly, in Example 2, for writing data into a memory cell M1$j$ having a low cumulative resistance value of the source line at the memory cell, a resistance regulation circuit 3 applies a voltage to the drain of the memory cell M1$j$ via the selector 1 and the bit line Bitj such that a source-drain potential, which is substantially the same as that for writing data into the memory cell M11 having a large cumulative resistance value of a source line at the memory cell, can be obtained. Thus, it is possible to relax a difference in write conditions in accordance with the positions of the memory cells.

With respect to the above description, since cumulative resistance values of the bit line at the memory cells M11 through M1$j$ are substantially equal, a difference in cumulative resistance values of the source line at the memory cells M11 through M1$j$ is described. However, even when there is a difference in cumulative resistance values of the bit lines at the memory cells M11 through M1$j$, as long as the resistance regulation circuit 3 acts to reduce a difference in cumulative resistance values of the bit lines at the memory cells M11 through M1$j$, an effect similar to the above-described effect can be achieved.

Thus, as long as the resistance regulation circuit 3 reduces a difference in cumulative resistance values of the connection lines at the memory cells M11 through M1$j$, a result similar to the above-described effect can be achieved.

Figure 5:
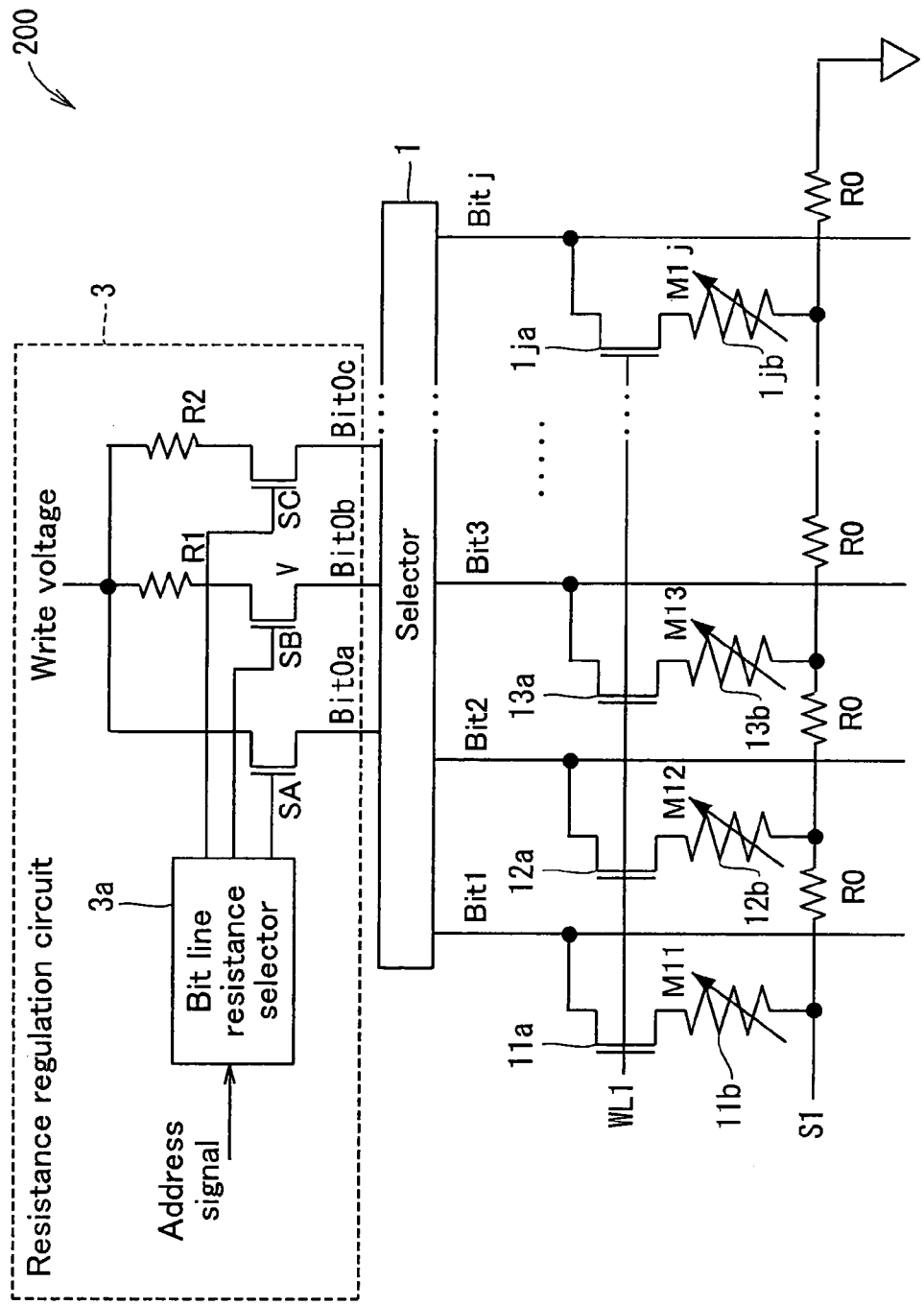
FIG. 5 is a circuit diagram illustrating an example of a resistance regulation circuit of FIG. 4.

FIG. 5 is a circuit diagram illustrating an example of the resistance regulation circuit 3 of FIG. 4.

In FIG. 5, the resistance regulation circuit 3 includes a bit line resistance selector 3a, an n-type MOS transistor SA, an n-type MOS transistor SB, and an n-type MOS transistor SC. Gates of the n-type MOS transistors SA, SB, and SC are respectively connected to the bit line resistance selector 3a.

A write voltage is applied to the resistance regulation circuit 3. The write voltage is transmitted to the selector 1 via any of three wiring paths.

One of the wiring paths which are capable of transmitting a write voltage is a wiring path which is not provided with a specific resistance element. The wiring path is provided with the n-type MOS transistor SA.

Another wiring path which is capable of transmitting a write voltage is provided with a resistance element R1 and the n-type MOS transistor SB.

Still another wiring path which is capable of transmitting a write voltage is provided with a resistance element R2 and the n-type MOS transistor SC.

Each of the n-type MOS transistors SA, SB, and SC acts as a switch element.

An address signal is input to the bit line resistance selector 3a of the resistance regulation circuit 3. The bit line resistance selector 3a acts as a selection circuit for selecting whether to turn on or off the n-type MOS transistors SA through SC based on the address signal. As a result, a wiring path for transmitting a write voltage is selected and the desired resistance value corresponding to the positions of the memory cells can be obtained.

In the memory array in which the plurality of memory cells are provided in a matrix, a cumulative resistance value of the source line at the memory cell when the memory cell M11 is designated and a cumulative resistance value of the source line at the memory cell when the memory cell M1$j$ is designated are different.

In order to obtain the same source-drain potentials for writing data into a memory cell having a low resistance value of the source line at the memory cell (for example, the memory cell M1$j$) and for writing data into a memory cell M11 having a high cumulative resistance value of the source line at the memory cell, a selection signal to be output from the bit line resistance selector 3a is used to select whether to turn on or off each of the n-type MOS transistors SA through SC and select at least one of the wiring paths having different resistance values. Thus, an influence due to a difference in cumulative resistance values of a source line at each of the memory cells can be reduced.

In the resistance regulation circuit 3, the bit line resistance selector 3a selects which of the n-type MOS transistors SA through SC to turn on or off based on an address signal which has been input.

Herein, a desired resistance value corresponding to the position of the memory cell is obtained by selecting one or more of the three wiring paths. However, the number of the wiring paths which is capable of being selected is not limited to this.

Figure 6:
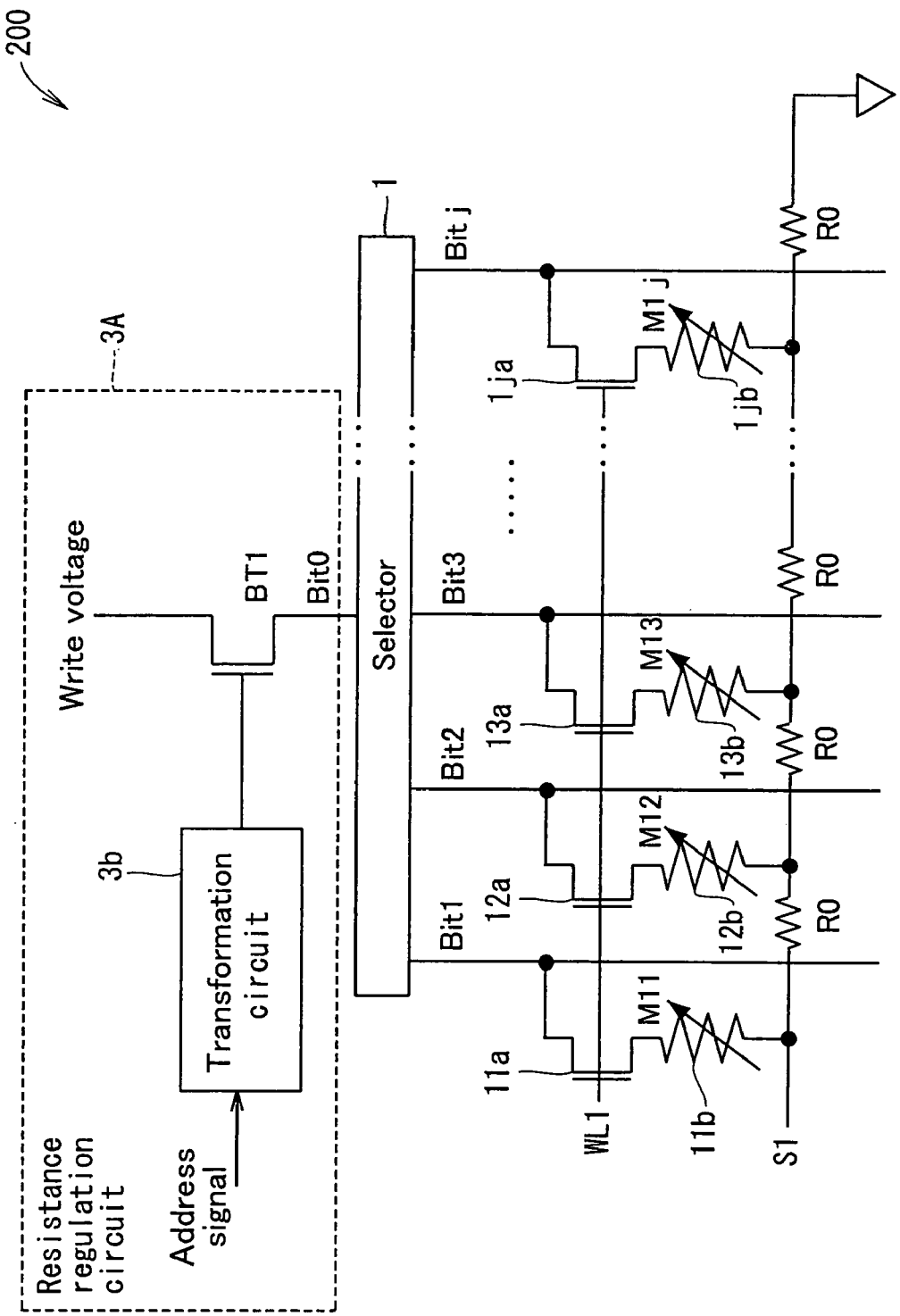
FIG. 6 is a circuit diagram illustrating another example of the resistance regulation circuit of FIG. 4.
Figure 7:
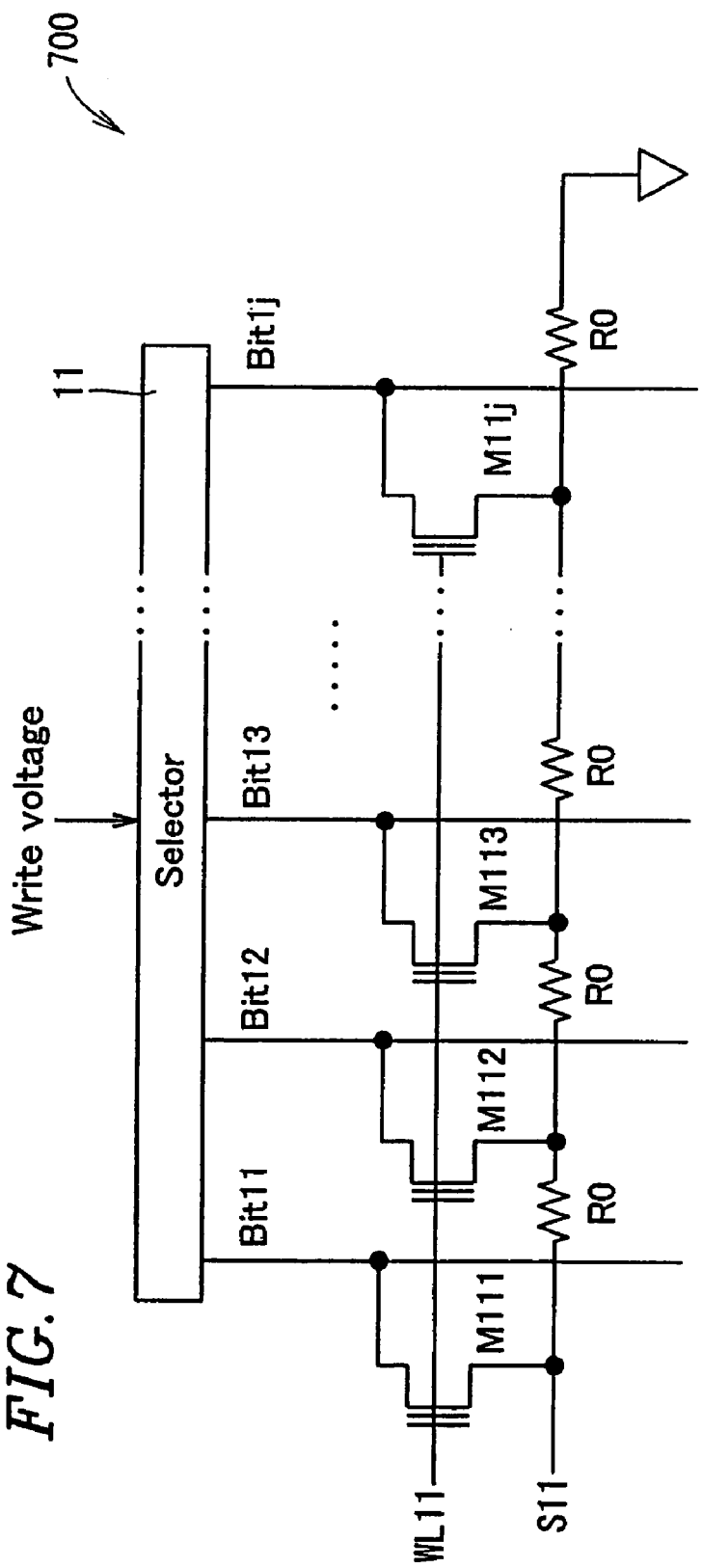
FIG. 7 is a circuit diagram showing a structure of a conventional floating-gate type flash memory.
Figure 8:
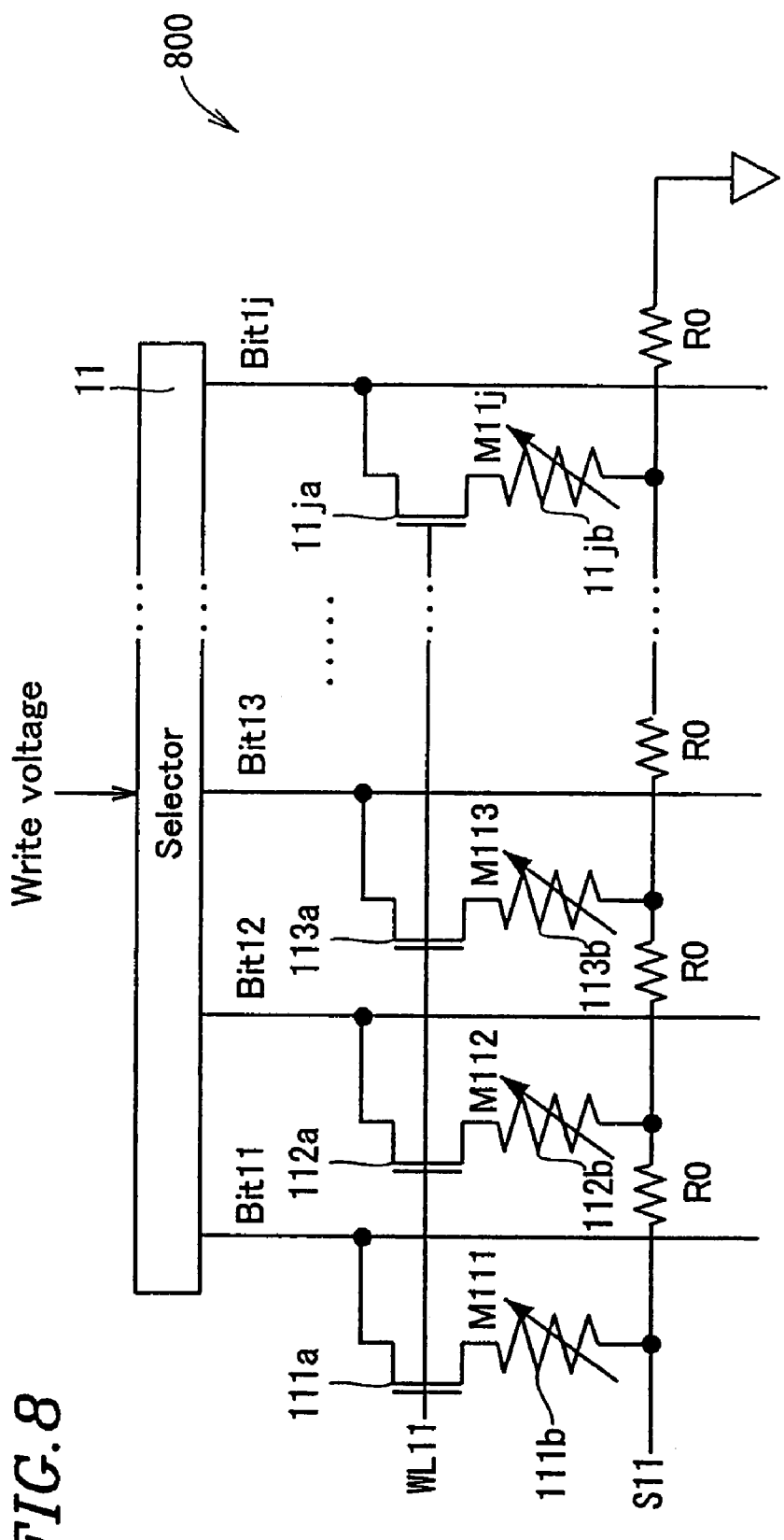
FIG. 8 is a circuit diagram showing a structure of a 1T1R type memory using a conventional variable resistance element.
Figure 9A:
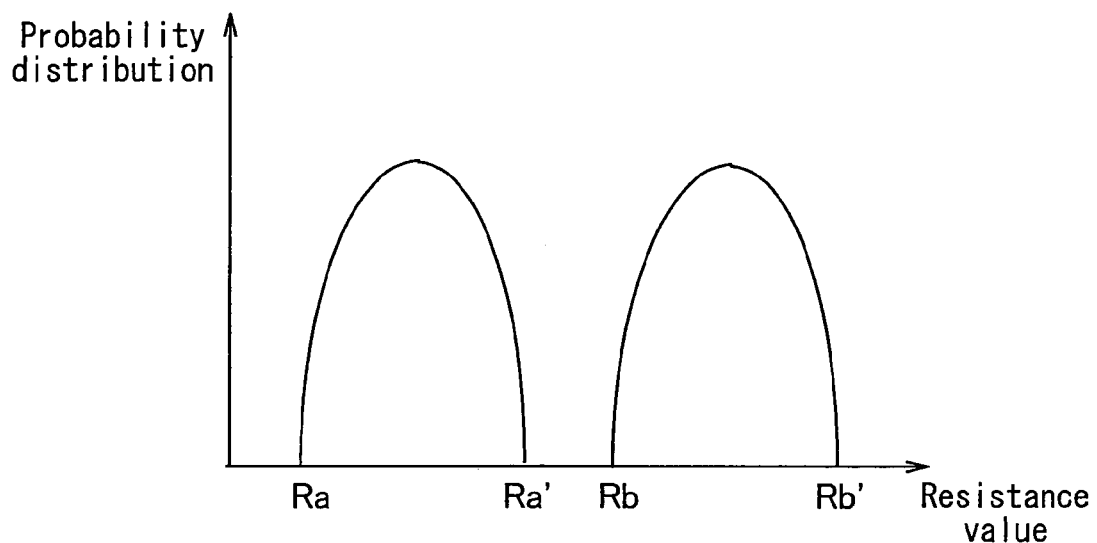
FIG. 9A is a graph showing a probability distribution of resistance values of a memory cell which is capable of storing two data values.
Figure 9B:
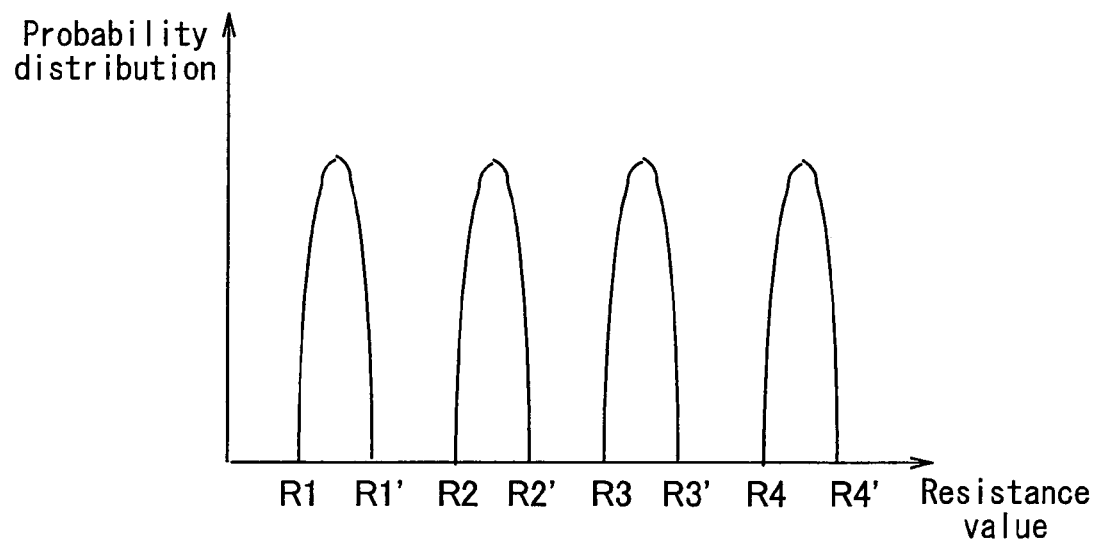
FIG. 9B is a graph showing a probability distribution of resistance values of a memory cell which is capable of storing four data values.

FIG. 6 is a circuit diagram illustrating the resistance regulation circuit 3A, i.e., another example of the resistance regulation circuit 3 of FIG. 4.

In FIG. 6, the resistance regulation circuit 3A comprises an n-type MOS transistor BT1 which acts as a switching transistor and a transformation circuit 3b for changing a gate voltage to be applied to a gate of the n-type MOS transistor BT1 based on an address signal.

An address signal is input to the transformation circuit 3b of the resistance regulation circuit 3A. The transformation circuit 3b changes a gate voltage to be applied to a gate of the n-type MOS transistor BT1, based on the address signal, to change the ON resistance of the n-type MOS transistor BT1. Thus, it is possible to obtain a desired resistance value corresponding to the position of the memory cell.

In a memory array in which a plurality of memory cells are provided in a matrix, a cumulative resistance value of the source line at the memory cell when the address signal designates the memory cell M11 and a cumulative resistance value of the source line at the memory cell when the address signal designates the memory cell M1j are different. In order to obtain the same source-drain potentials for writing data into a memory cell having a low resistance value of the source line at the memory cell (for example, the memory cell M1j) and for writing data into a memory cell having a high cumulative resistance value of the source line at the memory cell (for example, the memory cell M11), a gate voltage to be applied to a gate of the n-type MOS transistor BT1 is changed and the ON resistance of the n-type MOS transistor BT1 is changed. Thus, an influence due to a difference in cumulative resistance values of a source line at each of the memory cells can be reduced.

In the resistance regulation circuit 3A, the transformation circuit 3b controls a gate voltage to be applied to the gate of the n-type MOS transistor BT1 based on an address signal which has been input.

As described above, according to the nonvolatile semiconductor storage apparatus of Example 2, the resistance regulation circuit 3 or the resistance regulation circuit 3A provided before start portions of the bit lines can relax an influence due to the difference in cumulative resistance values of the source line at each of the memory cells in accordance with the positions of the memory cells.

Thus, Examples 1 and 2 provide a nonvolatile semiconductor storage apparatus in which a plurality of memory cells M11 through M1j are arranged within a matrix, a plurality of source lines including a source line S1 are oriented along a row direction and a plurality of bit lines Bit1 through Bitj are oriented along a column direction. Sources of the plurality of memory cells located along the row direction are connected to a common source line. Drains of the plurality of memory cells located along the column direction are connected to a common bit line. In such a nonvolatile semiconductor storage apparatus, a resistance regulation circuit is provided at one of an end of the source line and an end of the bit line. Thus, it is possible to relax an influence due to a difference in cumulative resistance values of the connection line at each of the memory cells to suppress a variance in storage states of the memory cells.

In Example 1, a resistance regulation circuit is provided at an end of the source line. In Example 2, a resistance regulation circuit is provided at an end of the bit lines. However, it is possible to provide resistance regulation circuits at an end of the source line and also at an end of the bit lines to reduce an influence of a variance in cumulative resistance values of a connection line at each of the memory cells in accordance with the positions of memory cells by using two resistance regulation circuits.

In Examples 1 and 2, an example in which a write operation to a memory cell is performed is described. However, the present invention is not limited to a write operation. It is possible to enhance an operational margin for access operations including erase operation and read operation of data to and from a memory cell by relaxing an influence due to a difference in cumulative resistance values of a connection line at each of memory cells in accordance with the positions of memory cells.

In the above description of Examples 1 and 2, a method is described for relaxing an influence due to a difference in cumulative resistance values of the source line at each of the memory cells, in accordance with the positions of memory cells for the memory cells M11 through M1j, located along a row direction and connected to a common source line. However, the present invention is not limited to this. The present invention can relax an influence due to a difference in cumulative resistance values of a bit line at each of the memory cells in accordance with the positions of the memory cells for the memory cells located along a column direction and connected to a common bit line.

Further, in the above description of Examples 1 and 2, a memory cell is a 1T1R type variable resistance element memory a using a variable resistance element. However, a memory cell used in the present invention is not limited to this. A memory cell in the present invention may be a floating-gate type flash memory having a floating gate. In this case, it is possible to relax at least one of a difference in cumulative resistance values of a source line at each of the memory cells and a difference in cumulative resistance values of a bit line at each of the memory cells which vary in accordance with the positions of the memory cells.

According to the present invention, a resistance regulation section reduces a difference in resistance values of a connection line connected to memory cells. Thus, it is possible to prevent a memory cell from not being properly accessed due to a difference in resistance values of connection lines connected to the memory cells.

Further, it is possible to regulate a difference in cumulative resistance values of at least one of a source line and a bit line at each of the memory cells. Thus, in access operations (more specifically, a write operation, an erase operation or a read operation) to and from a memory cell, influence that cumulative resistance values of a source line or a bit line at each of the memory cells vary depending on the positions of the memory cells can be suppressed. This allows enhancement of an operational margin. This is particularly effective in a nonvolatile semiconductor storage apparatus which is capable of storing a plurality of data values.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonvolatile semiconductor storage apparatus comprising:
   a first memory cell capable of storing a plurality of data values;
   a second memory cell capable of storing a plurality of data values;
   a resistance regulation section capable of regulating resistance, which regulates resistance such that a difference between a resistance value of a first connection line connected to the first memory cell and a resistance value of a second connection line connected to the second memory cell is reduced.

2. A nonvolatile semiconductor storage apparatus according to claim 1, wherein:
   the first memory cell includes a first transistor having a first gate, a first source, and a first drain;
   the second memory cell includes a second transistor having a second gate, a second source, and a second drain;

the first connection line includes a first bit line connected to the first drain and a first source line connected to the first source; and the second connection line includes a second bit line connected to the second drain and a second source line connected to the second source.

3. A nonvolatile semiconductor storage apparatus according to claim 1, wherein:

the first memory cell includes a first transistor having a first gate, a first source, and a first drain;

the second memory cell includes a second transistor having a second gate, a second source, and a second drain;

the first connection line includes a first source line connected to the first source; and the second connection line includes a second source line connected to the second source.

4. A nonvolatile semiconductor storage apparatus according to claim 1, wherein:

an address signal designating the first memory cell or the second memory cell is input to the resistance regulation section; and the resistance regulation section regulates resistance based on the address signal.

5. A nonvolatile semiconductor storage apparatus according to claim 2, wherein the resistance regulation section is connected to the first source line and the second source line.

6. A nonvolatile semiconductor storage apparatus according to claim 2, wherein the resistance regulation section is provided before start portions of the first bit line and the second bit line.

7. A nonvolatile semiconductor storage apparatus according to claim 1, wherein the resistance regulation section regulates resistance based on a position of the first memory cell and a position of the second memory cell.

8. A nonvolatile semiconductor storage apparatus according to claim 2, wherein:

the first memory cell includes a first serial circuit in which a first variable resistance element and a first current control element are connected in series, one end of the first serial circuit being connected to the first bit line and other end of the first serial circuit being connected to the first source line; and the second memory cell includes a second serial circuit in which a second variable resistance element and a second current control element are connected in series, one end of the second serial circuit being connected to the second bit line and other end of the second serial circuit being connected to the second source line.

9. A nonvolatile semiconductor storage apparatus according to claim 8, wherein each of the first variable resistance element and the second variable resistance element includes PCMO ($Pr_{0.7}Ca_{0.3}MnO_3$).

10. A nonvolatile semiconductor storage apparatus according to claim 2, wherein:

the first memory cell includes a first MOS transistor having a first floating gate, one end of the first MOS transistor being connected to the first bit line and the other end of the first MOS transistor being connected to the first source line; and the second memory cell includes a second MOS transistor having a second floating gate, one end of the second MOS transistor being connected to a second bit line and the other end of the second MOS transistor being connected to the second source line.

11. A nonvolatile semiconductor storage apparatus according to claim 1, wherein the first memory cell and the second memory cell are each capable of storing three or more data values.

12. A nonvolatile semiconductor storage apparatus according to claim 1, wherein the resistance regulation section includes a plurality of resistance elements and controls the number of resistance elements, among the plurality of resistance elements, which are electrically connected to the first connection line and the second connection line.

13. A nonvolatile semiconductor storage apparatus according to claim 1, wherein the resistance regulation circuit includes:

a resistance section in which a plurality of resistance elements are connected in series;

a plurality of switch elements, the switch elements being connected to both ends of the resistance section and a connection portion to which the plurality of the resistance elements are connected; and a selection circuit for selecting whether to turn on or off each of the plurality of the switch elements based on an address signal designating the first memory cell or the second memory cell, the selection circuit selecting whether to turn on or off each of the plurality of the switch elements such that the resistance of the resistance section is changed.

14. A nonvolatile semiconductor storage apparatus according to claim 1, wherein the resistance regulation section includes:

a transistor having a gate, a source, and a drain; and a transformation circuit for changing a gate voltage to be applied to the gate of the transistor based on an address signal designating the first memory cell or the second memory cell, the transformation circuit changing the gate voltage such that an ON resistance of the transistor is changed.

15. A nonvolatile semiconductor storage apparatus according to claim 1, wherein the resistance regulation section includes:

a plurality of wiring paths each having a different resistance value;

a plurality of switch elements corresponding to the plurality of wiring paths, each of the plurality of switch elements is provided in a respective one of the plurality of wiring paths; and a selection circuit for selecting whether to turn on or off each of the plurality of the switch elements based on an address signal designating the first memory cell or the second memory cell, the selection circuit selecting at least one of the plurality of wiring paths by using each of the plurality of switch elements.

* * * * *